United States Patent [19]
Sandhu

[11] Patent Number: 5,776,836
[45] Date of Patent: Jul. 7, 1998

[54] SELF ALIGNED METHOD TO DEFINE FEATURES SMALLER THAN THE RESOLUTION LIMIT OF A PHOTOLITHOGRAPHY SYSTEM

[75] Inventor: Gurtej Singh Sandhu, Boise, Id.

[73] Assignee: Micron Technology, Inc., Boise, Id.

[21] Appl. No.: 608,691

[22] Filed: Feb. 29, 1996

[51] Int. Cl.$^6$ .................................................. H01L 21/00
[52] U.S. Cl. ............................. 438/717; 216/41; 216/67; 438/723
[58] Field of Search ........................... 156/643.1, 644.1, 156/659.11, 661.11, 657.1; 216/41, 56, 67; 437/189, 190; 438/717, 723, 736

[56] References Cited

U.S. PATENT DOCUMENTS

| | | | |
|---|---|---|---|
| 4,759,822 | 7/1988 | Vetanen et al. | 156/644.1 |
| 4,774,206 | 9/1988 | Willer | 437/175 |
| 5,294,296 | 3/1994 | Yoon et al. | 156/644.1 X |
| 5,384,281 | 1/1995 | Kenney et al. | 437/189 |
| 5,403,435 | 4/1995 | Cathey et al. | 156/643 |
| 5,403,779 | 4/1995 | Joshi et al. | 437/190 |
| 5,500,080 | 3/1996 | Choi | 156/644.1 |

*Primary Examiner*—William Powell
*Attorney, Agent, or Firm*—Workman, Nydegger & Seeley

[57] ABSTRACT

A first mask layer is deposited over a layer to be etched, which is itself situated on a semiconductor wafer. The first mask layer is then patterned by standard techniques using a given photolithography system, with a feature size at or near the resolution limit of the system employed, uncovering thereby a pattern on the layer to be etched. Next, a second mask layer is anisotropically deposited over the wafer surface, with the wafer surface tilted at a selected angle from the normal to the direction of the deposition. The angle is selected such that the first mask layer shields a portion of the pattern from the anisotropic stream of deposited material forming the second mask layer. The second mask layer thus deposits on only a portion of the previously uncovered pattern, leaving a remaining pattern having a feature size smaller than the resolution limit, or smaller than the smallest feature which can be printed, using the photolithography system employed. The layer to be etched is then etched with an etch process selective to the second mask layer. The first and second mask layers may then be removed, leaving the layer to be etched having a feature defined therein with a width smaller than the resolution limit of the photolithography system. The feature may be filled with a fill material, and the layer to be etched may then optionally be removed.

50 Claims, 3 Drawing Sheets

5,776,836

SELF ALIGNED METHOD TO DEFINE FEATURES SMALLER THAN THE RESOLUTION LIMIT OF A PHOTOLITHOGRAPHY SYSTEM

BACKGROUND OF THE INVENTION

1. The Field of the Invention

The present invention relates to the manufacture of semiconductor devices. More particularly, the present invention is directed to methods for defining features smaller than the critical dimensions of the photolithography technique employed in the manufacture of semiconductor devices.

2. The Relevant Technology

In traditional semiconductor device fabrication, the smallest structures which can be defined by a given photolithographic technique are limited by the wavelength of the light employed, the numerical aperture of the stepper, and other related factors. It is sometimes very desirable to be able, at one or two critical mask steps in a semiconductor process flow, to define features smaller than those resolvable by state of the art steppers. But it is not generally economically feasible to use alternative, more expensive photolithography equipment for just one or two mask steps.

Accordingly, there is a need for a method, preferably one easily implemented with existing equipment, to define features smaller than those allowed by a given photolithography process.

SUMMARY AND OBJECTS OF THE INVENTION

An object of the present invention is to provide a method which employs a given photolithography system having an inherent resolution limit, yet defines features smaller than the photolithography system can print, or smaller than the resolution limit thereof.

Another object of the present invention is to provide a method which employs a given photolithography system having an inherent resolution limit, yet defines features smaller than the resolution limit of that system which method is easily implemented with existing equipment.

In accordance with the present invention, a first mask layer is deposited over a layer to be etched, which is itself situated on a semiconductor wafer. The first mask layer is then patterned by standard techniques using a given photolithography system, with a feature size at or near the resolution limit of the system employed, uncovering thereby a pattern on the layer to be etched. Next, a second mask layer is anisotropically deposited over the wafer surface, with the wafer surface tilted at a selected angle from the normal to the direction of the deposition. The angle is selected such that the first mask layer shields a portion of the pattern from the anisotropic stream of deposited material forming the second mask layer. The second mask layer thus deposits on only a portion of the previously uncovered pattern, leaving a remaining pattern having a feature size smaller than the critical dimensions of the photolithography system employed. The layer to be etched is then etched with an etch process selective to the second mask layer. The first and second mask layers are then removed.

The above inventive process flow provides a method of defining features smaller than the critical dimensions of the photolithography system employed, which method can employ various types of known anisotropic deposition techniques, such that the inventive process flow can be implemented with existing equipment.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered with reference to specific examples of the application thereof which are illustrated in the appended drawings. Understanding that these drawings depict only typical applications of the invention and are not therefore to be considered to be limiting of its scope, the invention will be described and explained with additional specificity and detail with reference to the accompanying drawings in which.

DETAILED DESCRIPTION OF THE PREFERRED EMBODIMENTS

The present invention provides a method for defining features smaller than critical dimensions. The method begins with a wafer having a layer to be etched on a surface thereof. The layer to be etched may be formed on the wafer by any conventional technique desired. The layer to be etched may be any type of layer desired to be etched, including but not limited to layers such as silicon nitride and various oxides of silicon.

Next, a first mask layer is formed over the layer to be etched. The first mask layer may be a positive or negative photoresist, or may be a non-photosensitive layer.

Then portions of the first mask layer are removed by use of a particular photolithography system. If the first mask layer is itself comprised of photoresist, portions thereof are removed by exposing and developing the first mask layer. If the first mask layer is not photosensitive, portions of the first mask layer may be removed by depositing a layer of photoresist thereover; exposing the photoresist with the photolithography system; developing the photoresist; etching the first mask layer to remove portions of the first mask layer, then removing the photoresist. The removal of portions of the first mask layer exposes a pattern of the layer to be etched. At least one section of the pattern has a width at or near the critical dimension of the photolithography system.

Figure 1:
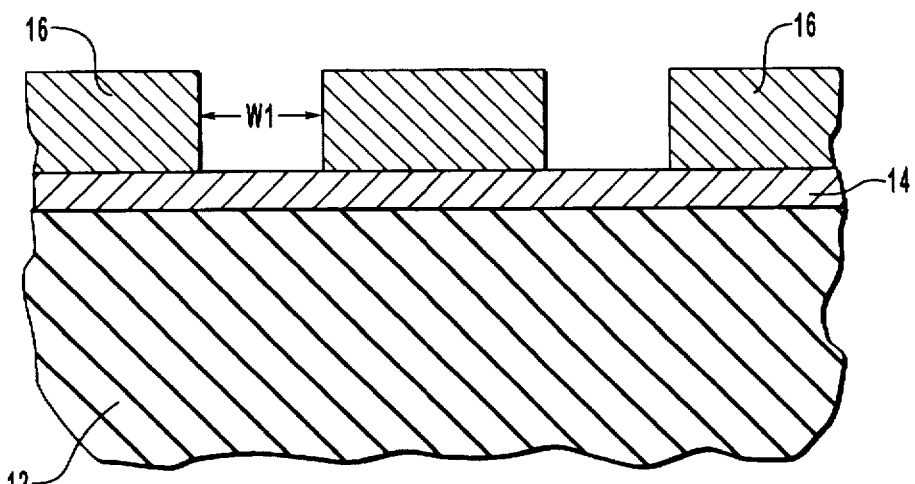
FIG. 1 is a cross section of a portion of a partially formed semiconductor device after deposition of a first mask layer and removal of portions thereof.

The effects performing the method of the present invention to this point are shown in FIG. 1. FIG. 1 shows a portion of a cross section of a semiconductor wafer with a layer to be etched 14 having been formed on an underlying layer 12. Underlying layer 12 may be a substrate of the semiconductor wafer itself or any other underlying layer. A first mask layer 16 has been formed over layer to be etched 14. Portions of first mask layer 16 have been removed, exposing through first mask layer 16 a pattern of layer to be etched 14. The pattern includes a section having a width W1 at or near the critical dimension of the photolithography system.

Next a second mask layer is deposited anisotropically, i.e., by a deposition technique having a highly directional flux of deposition material. The second mask layer may be comprised of any material for which a highly directional deposition technique is reasonably available, including for example metals such as aluminum and titanium. The deposition technique employed may include any suitably directional deposition technique such as collimated sputtering, biased sputtering with negative bias at the wafer, collimated biased sputtering, plasma enhanced directional chemical vapor deposition, and the like. The deposition direction of the anisotropic deposition is angled relative to the surface of the wafer such that the remaining portions of the first mask layer shield from the anisotropic deposition a shielded portion of the exposed pattern of the layer to be etched.

Figure 2:
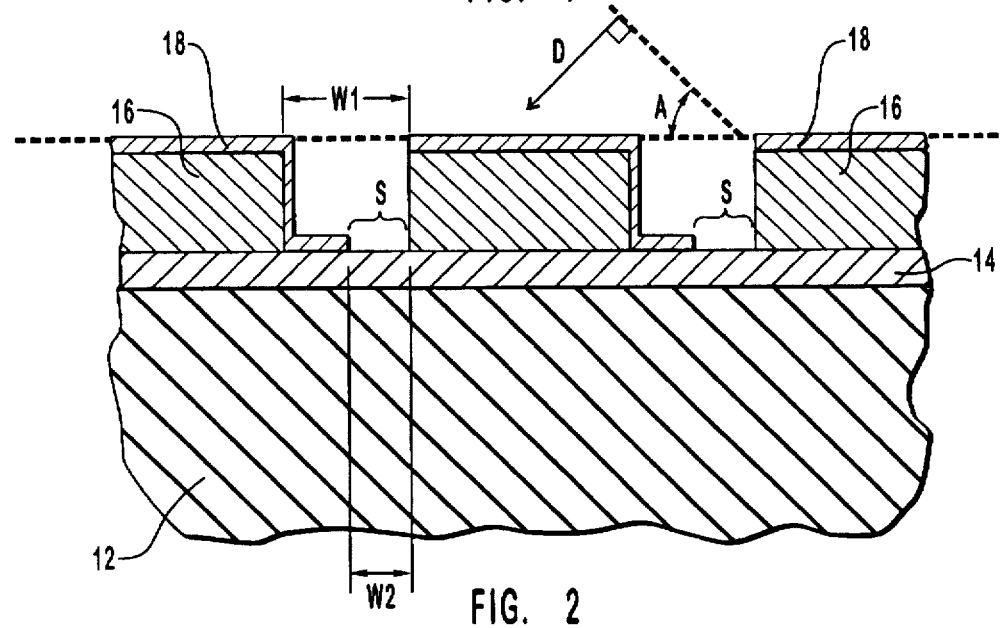
FIG. 2 is the cross section of FIG. 1 after anisotropic directional deposition of an additional masking material.

The results of this step are shown in the cross section of FIG. 2. In FIG. 2, a second mask layer 18 has been deposited anisotropically with a deposition direction along direction D at an angle A relative to the surface of the wafer. The remaining portions of first mask layer 16 have substantially shielded from the deposition of second mask layer 18 a shielded portion S of the exposed pattern of layer to be etched 14, which shielded portion S includes a part of width W1 having a width W2.

Figure 3:
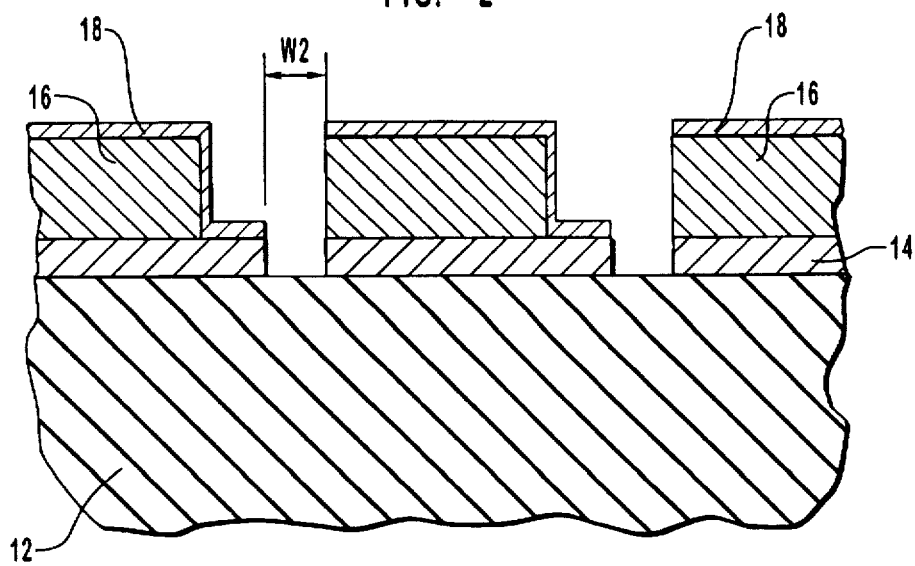
FIG. 3 is the cross section of FIG. 2 after a dry etch of a layer to be etched.

Next, layer to be etched 14 is etched with a dry etch process selective to a material of which second mask layer 18 is comprised. With layer to be etched 14 comprised of an oxide of silicon and with second mask layer 18 comprising aluminum, for example, a fluorine-based dry etch is highly selective and therefore quite useful. This results in the removal of layer to be etched 14 at shielded portions S of the pattern, and the definition of a feature in layer to be etched 14 having width W2 smaller than width W1, which is the resolution limit or the smallest dimension printable by the photolithography system. This is seen in the cross section of FIG. 3, where shielded portion S of the pattern having width W2 has been formed in layer to be etched 14. W1 can also be processed to be wider than the inherent resolution limit of the photolithography system, as can be W2.

First and second mask layers 16, 18 are then removed, leaving layer to be etched 14 with the desired features etched therein.

As an optional step, the above method may also include, before etching layer to be etched 14, etching second mask layer 18 for a time sufficient to remove any accumulation of the material of which second mask layer 18 is comprised on shielded portion S of the exposed pattern of layer to be etched 14. This optional etch should naturally be kept short enough to avoid removing second mask layer 18 from the non-shielded portion of the pattern.

Figure 4:
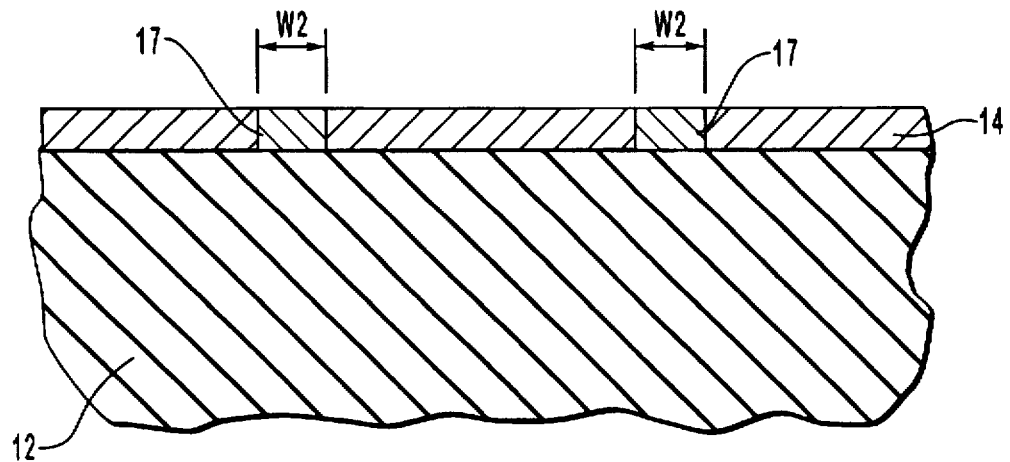
FIG. 4 is the cross section of FIG. 3 after deposition of fill material and removal of material overlying the layer to be etched.
Figure 5:
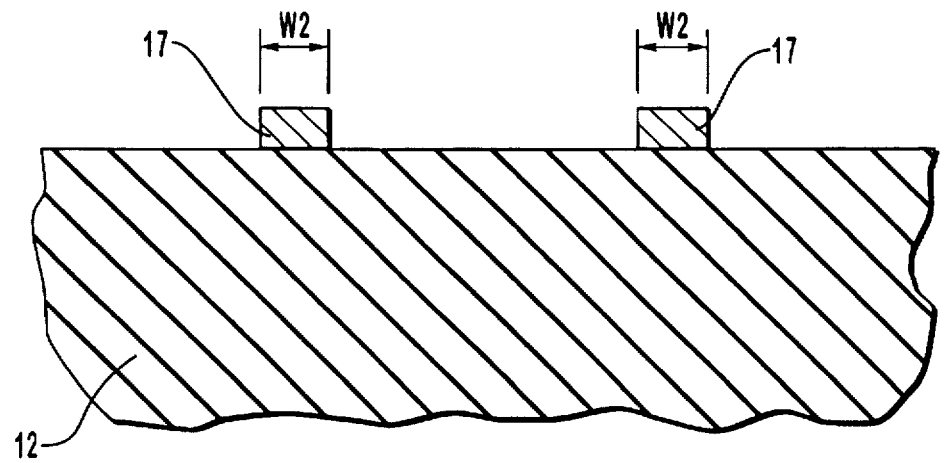
FIG. 5 is the cross section of FIG. 4 after removal of the layer to be etched.

As a further optional step, a layer of fill material may be deposited conformably over second mask layer 18 and underlying layer 12, filling the spaces in layer to be etched 14. Alternatively, second mask layer may first be removed by any acceptable known etch technique, then a layer of fill material may be deposited conformably over first mask layer 16, layer to be etched 14, and underlying layer 12. In either case, chemical mechanical polishing or an etch back process may then be used to remove the uppermost layers down to layer to be etched 14. This results in the structure shown in FIG. 4, with features composed of fill material 17 having been formed in the spaces in layer to be etched 14, the features having a width W2 less than the resolution limit of the photolithography system. Additionally, layer to be etched 14 may then be removed by an etch process selective to fill material 17, resulting in the structure shown in FIG. 5, with features composed of fill material 17 having been formed on underlying layer 12, the features having a width W2 less than the resolution limit of the photolithography system.

Figure 6:
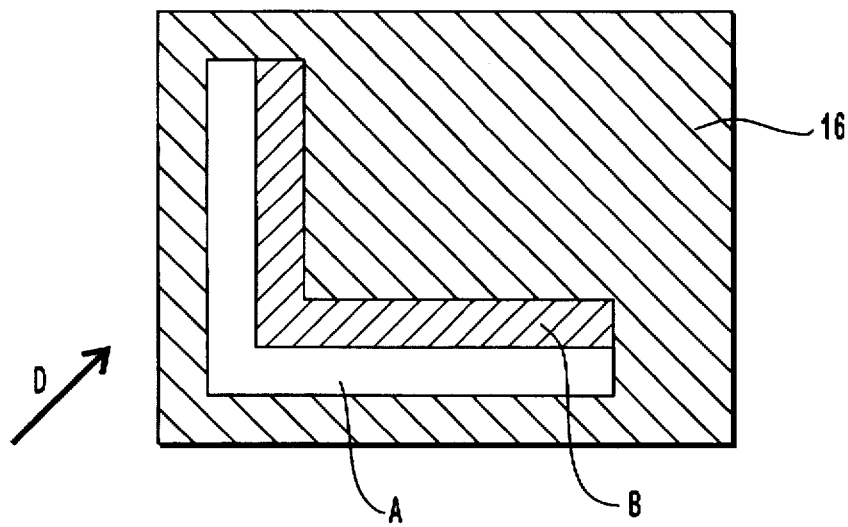
FIG. 6 is a plan view of an L-shaped pattern in a first mask layer in which a shaded area shows the area covered by a second mask layer.
Figure 7:
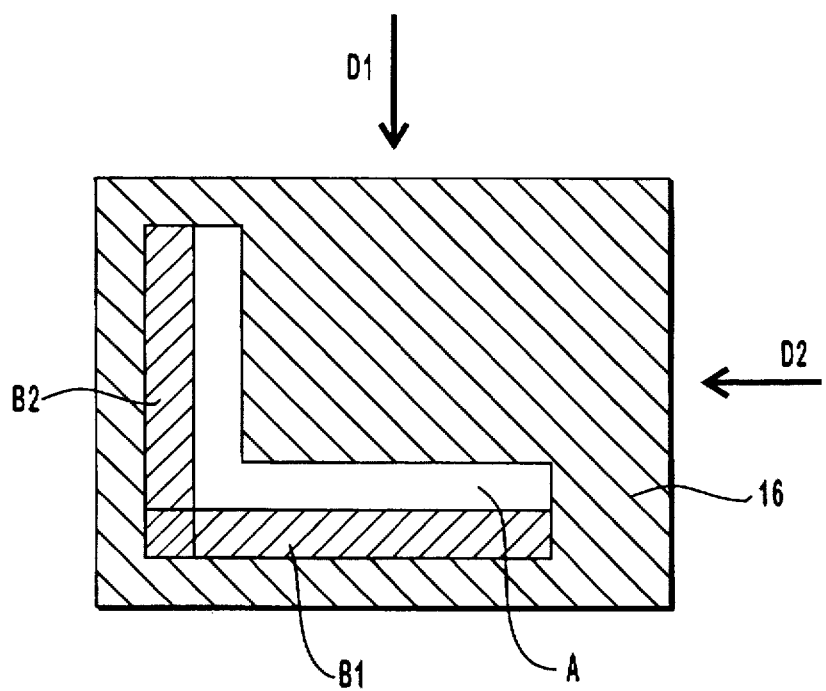
FIG. 7 is a plan view of an L-shaped pattern in a first mask layer in which shaded areas show the areas covered by a second mask layer.

Both the deposition direction D and angle A may be varied with respect to predominant directions of lines in the pattern, depending on the desired effect. A deposition direction having a component perpendicular to a line will have the effect of narrowing that line. Thus a deposition direction may be selected having a component perpendicular to some lines, but not to others, if only some lines are desired to be narrowed. If all major lines in a pattern are desired to be narrowed, a deposition direction should be selected having components perpendicular to every major line. This is illustrated in FIG. 6, where an L-shaped unshielded A pattern has been formed in a first mask layer 16. Deposition along a direction D in FIG. 6 deposits in shaded area B of the L-shaped pattern, thus narrowing both lines of the L-shaped pattern. Alternatively, deposition of a second masking layer may be performed in two steps along two different directions D1 and D2, and followed by an etch of L-shaped unshaded pattern A, as illustrated in FIG. 7 to deposit in shaded areas B1 and B2 respectively. The method illustrated in FIG. 6 is more versatile, however, and is therefore preferred.

The angle of the deposition direction relative to the surface of the wafer may of course also be varied as desired to achieve a desired feature size with a given critical dimension and a given thickness of the first mask layer.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for defining features smaller than a feature defined by a given photolithography system used in the manufacture of a semiconductor device, said method comprising the steps of:

(a) providing a semiconductor wafer having on a surface thereof a layer to be etched;

(b) forming over said layer to be etched a first mask layer;

(c) removing portions of said first mask layer by the use of a given photolithography system having an inherent resolution limit so as to leave a remaining portion of said first mask layer, and so as to expose thereby through said first mask layer an exposed pattern of said layer to be etched;

(d) anisotropically depositing a second mask layer, over said first mask layer and said layer to be etched, in a deposition direction relative to the surface of the semiconductor wafer such that the remaining portion of said first mask layer substantially shield from the anisotropic deposition a shielded portion of said exposed pattern of said layer to be etched, said shielded portion having a width less than the width of said exposed pattern, leaving said shielded portion of said exposed pattern of said layer to be etched substantially exposed; and (e) etching the layer to be etched with an etch process selective to a material of which the second mask layer is comprised, such that the layer to be etched is removed at said shielded portion of said exposed pattern of said layer to be etched, whereby a feature is defined in said layer to be etched having a width not greater than the width of said exposed pattern of said layer to be etched.

2. The method as defined in claim 1, further comprising the steps, to be performed after said step of etching the layer to be etched, of:

(a) depositing a fill material conformably over said surface of said semiconductor wafer and all layers thereon, filling said feature in said layer to be etched; and (b) removing all material above said layer to be etched.

3. The method as defined in claim 2, wherein said step of removing all material above said layer to be etched comprises chemical mechanical polishing downward at least to the top of said layer to be etched.

4. The method as defined in claim 2, wherein said step of removing all material above said layer to be etched comprises performing an etch back process downward at least to the top of said layer to be etched.

5. The method as defined in claim 2, further comprising the step, to be performed before said step of depositing a fill material, of removing said second mask layer.

6. The method as defined in claim 2, further comprising the step, to be performed after said step of removing all material above said layer to be etched, of removing said layer to be etched by use of an etch process selective to said fill material, leaving structures comprised of said fill material upon said surface of said semiconductor wafer.

7. The method as defined in claim 1, wherein the width of said exposed pattern of said layer to be etched is approximately the resolution limit of said photolithography system.

8. The method as defined in claim 1, comprising the additional step of removing the first and second mask layers after etching the layer to be etched.

9. The method as defined in claim 1, further comprising the step of, before the step of etching the layer to be etched, etching the second mask layer for a time sufficient to remove any accumulation of the material of which the second mask layer is comprised on the shielded portion of said exposed pattern of said layer to be etched without substantially removing the second mask layer over the first mask in areas other than the shielded portion of said exposed pattern of said layer to be etched.

10. The method as defined in claim 1, wherein said layer to be etched comprises an oxide of silicon.

11. The method as defined in claim 1, wherein said first mask layer comprises a positive photoresist.

12. The method as defined in claim 1, wherein said first mask layer comprises a negative photoresist.

13. The method as defined in claim 1, wherein said first mask layer comprises silicon dioxide.

14. The method as defined in claim 1, wherein said second mask layer comprises a metallic layer.

15. The method as defined in claim 14, wherein said metallic layer comprises titanium.

16. The method as defined in claim 14, wherein said metallic layer comprises aluminum.

17. The method as defined in claim 1, wherein said second mask layer comprises a silicon material.

18. The method as defined in claim 1, wherein said second mask layer comprises an electrical insulating layer.

19. The method as defined in claim 18, wherein said electrical insulating layer comprises silicon nitride.

20. The method as defined in claim 1, wherein said first mask layer comprises a photoresist, and wherein said step of removing portions of said first mask layer comprises the steps of:

(a) exposing said mask layer; and (b) developing said mask layer.

21. The method as defined in claim 1, wherein said first mask layer is not comprised of photosensitive material, and wherein said step of removing portions of said first mask layer comprises the steps of:

(a) depositing a layer of photoresist over said first mask layer;

(b) exposing said layer of photoresist;

(c) developing said layer of photoresist;

(d) etching said first mask layer; and (e) removing said layer of photoresist.

22. The method as defined in claim 1, wherein said step of anisotropically depositing a second mask layer comprises the step of depositing said second mask layer by collimated sputtering.

23. The method as defined in claim 22, wherein said step of depositing said second mask layer by collimated sputtering comprises depositing said second mask layer by collimated sputtering while negatively biasing the wafer.

24. The method as defined in claim 1, wherein said step of anisotropically depositing a second mask layer comprises the step of depositing said second mask layer by sputtering while negatively biasing the wafer.

25. The method as defined in claim 1, wherein said step of anisotropically depositing a second mask layer comprises the step of plasma enhanced directional chemical vapor deposition.

26. The method as defined in claim 1, wherein said exposed pattern of said layer to be etched comprises lines running predominantly in one predominant pattern direction, and wherein said deposition direction includes a component perpendicular to said predominant pattern direction.

27. The method as defined in claim 26, wherein said deposition direction further includes no component parallel to said predominant pattern direction.

28. The method as defined in claim 1, wherein said exposed pattern comprises lines running predominantly in two orthogonal predominant pattern directions, and wherein said deposition direction includes a component perpendicular to one of said predominant pattern directions but does not include a component perpendicular to the other of said predominant pattern directions.

29. The method as defined in claim 1, wherein said exposed pattern comprises lines running predominantly in two orthogonal predominant pattern directions, and wherein said deposition direction includes both a component perpendicular to one of said predominant pattern directions and a component perpendicular to the other of said predominant pattern directions.

30. The method as defined in claim 1, wherein said exposed pattern of said layer to be etched comprises lines running predominantly in two orthogonal predominant pattern directions, and wherein said step of anisotropically depositing a second mask layer comprises:

(a) anisotropically depositing a primary mask material in a first deposition direction, said first deposition direction including a component perpendicular to a first of said predominant pattern directions but not including a component perpendicular to a second of said predominant pattern directions; and (b) anisotropically depositing said primary mask material in a second deposition direction, said second deposition direction including a component perpendicular to the second of said predominant pattern directions but not including a component perpendicular to the first of said predominant pattern directions.

31. The method as defined in claim 30, further comprising the steps of etching said exposed pattern of said layer to be etched so as to remove therefrom any accumulation of the primary mask material.

32. A method for defining features smaller than an inherent resolution limit of a given photolithography system used in the manufacture of a semiconductor device, said method comprising the steps of:

(a) providing a semiconductor wafer having on a surface thereof a layer to be etched;

(b) forming over said layer to be etched a first mask layer comprised of photoresist;

(c) removing portions of said first mask layer by the use of a given photolithography system having an inherent resolution limit so as to leave a remaining portion of said first mask layer, and so as to expose thereby through said first mask layer an exposed pattern of said layer to be etched;

(d) anisotropically depositing a metallic second mask layer, over said first mask layer and said layer to be etched, in a deposition direction relative to the surface of the semiconductor wafer such that the remaining portion of said first mask layer shields from the anisotropic deposition a shielded portion of said exposed pattern of said layer to be etched, said shielded portion having a width less than the width of said exposed pattern, leaving said shielded portion of said exposed pattern of said layer to be etched substantially exposed; and (e) etching the layer to be etched with an etch process selective to a material of which the second mask layer is comprised, such that the layer to be etched is removed at said shielded portion of said exposed pattern of said layer to be etched, whereby a feature is defined in said layer to be etched having a width less than the resolution limit of the given photolithography process.

33. A method for defining features smaller than an inherent resolution limit of a given photolithography system used in the manufacture of a semiconductor device, said method comprising the steps of:

(a) providing a semiconductor wafer having on a surface thereof a layer to be etched comprised of an oxide of silicon;

(b) forming over said layer to be etched a first mask layer;

(c) removing portions of said first mask layer by the use of a given photolithography system having an inherent resolution limit so as to leave a remaining portion of said first mask layer, and so as to expose thereby through said first mask layer an exposed pattern of said layer to be etched;

(d) anisotropically depositing a second mask layer comprised of aluminum, over said first mask layer and said layer to be etched, in a deposition direction relative to the surface of the semiconductor wafer such that the remaining portions of said first mask layer shields from the anisotropic deposition a shielded portion of said exposed portion of said layer to be etched, said shielded patterned having a width less than the width of said exposed pattern, leaving said shielded portion of said exposed pattern of said layer to be etched substantially exposed;

(e) etching the second mask layer for a time sufficient to remove any accumulation of the material of which the second mask layer is comprised on the shielded portion of said exposed pattern of said layer to be etched without substantially removing the second mask layer over the first mask in areas other than the shielded portion of said exposed pattern of said layer to be etched; and (e) etching the layer to be etched with a fluorine-based dry etch process selective to a material of which the second mask layer is comprised, such that the layer to be etched is removed at said shielded portion of said exposed pattern of said layer to be etched, whereby a feature is defined in said layer to be etched having a width less than the resolution limit of the given photolithography process.

34. A masking method comprising:

forming a first mask layer over a layer to be etched;

removing a portion of said first mask layer to leave a remaining portion of said first mask layer and to expose through said first mask layer an exposed pattern of said layer to be etched;

depositing a second mask layer over said first mask layer and said layer to be etched in a deposition direction such that the remaining portion of said first mask layer substantially shields from the deposition a shielded portion of said exposed pattern of said layer to be etched, said shielded portion having a width less than the width of said exposed pattern, and leaving said shielded portion of said exposed pattern of said layer to be etched substantially exposed; and etching the layer to be etched with an etch process selective to a material of which the second mask layer is comprised, such that the layer to be etched is removed at said shielded portion of said exposed pattern of said layer to be etched.

35. The method as defined in claim 34, wherein etching the layer to be etched defines a feature in said layer to be etched having a width not greater than the width of said exposed pattern of said layer to be etched.

36. The method as defined in claim 35, further comprising forming a fill material so as to fill said feature in said layer to be etched.

37. The method as defined in claims 35, further comprising:

removing substantially all material above said layer to be etched; and removing said layer to be etched by use of an etch process selective to said fill material to leave a structure comprised of said fill material.

38. The method as defined in claim 34, wherein removing said portion of said first mask layer is performed by the use of a given photolithography system having an inherent resolution limit, and wherein the width of said exposed pattern of said layer to be etched is approximately the resolution limit of said photolithography system.

39. The method as defined in claim 34, further comprising, prior to etching the layer to be etched:

etching the second mask layer for a time sufficient to remove any accumulation of the material of which the second mask layer is comprised on the shielded portion of said exposed pattern of said layer to be etched without substantially removing the second mask layer over the first mask in areas other than the shielded portion of said exposed pattern of said layer to be etched.

40. The method as defined in claim 34, wherein said exposed pattern of said layer to be etched comprises lines running predominantly in one predominant pattern direction, and wherein said deposition direction includes a component perpendicular to said predominant pattern direction.

41. The method as defined in claim 40, wherein said deposition direction further includes no component parallel to said predominant pattern direction.

42. The method as defined in claim 34, wherein said exposed pattern of said layer to be etched comprises lines running predominantly in two orthogonal predominant pattern directions, and wherein said deposition direction includes a component perpendicular to one of said predominant pattern directions but does not include a component perpendicular to the other of said predominant pattern directions.

43. The method as defined in claim 34, wherein said exposed pattern of said layer to be etched comprises lines running predominantly in two orthogonal predominant pattern directions, and wherein said deposition direction includes both a component perpendicular to one of said predominant pattern directions and a component perpendicular to the other of said predominant pattern directions.

44. The method as defined in claim 34, wherein said exposed pattern of said layer to be etched comprises lines running predominantly in two orthogonal predominant pattern directions, and wherein depositing a second mask layer comprises:

anisotropically depositing a primary mask material in a first deposition direction, said first deposition direction including a component perpendicular to a first of said predominant pattern directions but not including a component perpendicular to a second of said predominant pattern directions; and anisotropically depositing said primary mask material in a second deposition direction, said second deposition direction including a component perpendicular to the second of said predominant pattern directions but not including a component perpendicular to the first of said predominant pattern directions.

45. A method of forming a feature, the method comprising:

forming a first mask layer over a layer to be etched, said layer to be etched being situated upon a surface of a substrate;

removing a portion of said first mask layer, using a photolithography system having an inherent resolution limit, to leave a remaining portion of said first mask layer and to expose through said first mask layer an exposed pattern of said layer to be etched;

depositing a second mask layer over said first mask layer and said layer to be etched in a deposition direction such that the remaining portion of said first mask layer substantially shields from the deposition a shielded portion of said exposed pattern of said layer to be etched, said shielded portion having a width less than the width of said exposed pattern, and leaving said shielded portion of said exposed pattern of said layer to be etched substantially exposed;

etching the second mask layer for a time sufficient to remove any accumulation of the material of which the second mask layer is comprised on the shielded portion of said exposed pattern of said layer to be etched without substantially removing the second mask layer over the first mask in areas other than the shielded portion of said exposed pattern of said layer to be etched;

etching the layer to be etched with an etch process selective to a material of which the second mask layer is comprised, such that the layer to be etched is removed at said shielded portion of said exposed pattern of said layer to be etched, whereby a feature is defined in said layer to be etched having a width not greater than the width of said exposed pattern of said layer to be etched, and wherein the width of said exposed pattern of said layer to be etched is approximately the resolution limit of said photolithography system;

forming a fill material over said surface of said substrate to fill said feature in said layer to be etched;

removing substantially all material above said layer to be etched; and removing said layer to be etched by use of an etch process selective to said fill material, leaving structures comprised of said fill material upon said surface of said substrate.

46. The method as defined in claim 45, wherein said exposed pattern of said layer to be etched comprises lines running predominantly in one predominant pattern direction, and wherein said deposition direction includes a component perpendicular to said predominant pattern direction.

47. The method as defined in claim 45, wherein said deposition direction further includes no component parallel to said predominant pattern direction.

48. The method as defined in claim 45, wherein said exposed pattern of said layer to be etched comprises lines running predominantly in two orthogonal predominant pattern directions, and wherein said deposition direction includes a component perpendicular to one of said predominant pattern directions but does not include a component perpendicular to the other of said predominant pattern directions.

49. The method as defined in claim 45, wherein said exposed pattern of said layer to be etched comprises lines running predominantly in two orthogonal predominant pattern directions, and wherein said deposition direction includes both a component perpendicular to one of said predominant pattern directions and a component perpendicular to the other of said predominant pattern directions.

50. The method as defined in claim 45, wherein said exposed pattern of said layer to be etched comprises lines running predominantly in two orthogonal predominant pattern directions, and wherein depositing a second mask layer comprises:

anisotropically depositing a primary mask material in a first deposition direction, said first deposition direction including a component perpendicular to a first of said predominant pattern directions but not including a component perpendicular to a second of said predominant pattern directions; and anisotropically depositing said primary mask material in a second deposition direction, said second deposition direction including a component perpendicular to the second of said predominant pattern directions but not including a component perpendicular to the first of said predominant pattern directions.

* * * * *

UNITED STATES PATENT AND TRADEMARK OFFICE
CERTIFICATE OF CORRECTION

PATENT NO. : 5,776,836
DATED       : Jul. 7, 1998
INVENTOR(S) : Gurtej Singh Sandhu It is certified that error appears in the above-identified patent and that said Letters Patent is hereby corrected as shown below:

Col. 8, line 1, after "remaining" change "portions" to --portion--

Col. 8, line 4, before "having" change "patterned" to --portion--

Signed and Sealed this

Twenty-third Day of March, 1999

Attest:

Q. TODD DICKINSON

Attesting Officer        Acting Commissioner of Patents and Trademarks